United States Patent
Kang et al.

(10) Patent No.: US 10,305,013 B2
(45) Date of Patent: May 28, 2019

(54) ELECTROLYTE SOLUTION FOR THERMOELECTRIC DEVICE AND THERMOELECTRIC DEVICE INCLUDING THE ELECTROLYTE SOLUTION

(71) Applicant: PUSAN NATIONAL UNIVERSITY INDUSTRY UNIVERSITY COOPERATION FOUNDATION OF PUSAN, Busan (KR)

(72) Inventors: Tae June Kang, Yangsan-si (KR); Yong Hyup Kim, Seoul (KR); Taewoo Kim, Changwon-si (KR)

(73) Assignee: PUSAN NATIONAL UNIVERSITY INDUSTRY UNIVERSITY COOPERATION FOUNDATION OF PUSAN, Busan (KR)

( * ) Notice: Subject to any disclaimer, the term of this patent is extended or adjusted under 35 U.S.C. 154(b) by 192 days.

(21) Appl. No.: 15/304,384

(22) PCT Filed: Apr. 13, 2015

(86) PCT No.: PCT/KR2015/003653
§ 371 (c)(1),
(2) Date: Nov. 14, 2016

(87) PCT Pub. No.: WO2015/160150
PCT Pub. Date: Oct. 22, 2015

(65) Prior Publication Data
US 2017/0207378 A1    Jul. 20, 2017

(30) Foreign Application Priority Data

Apr. 17, 2014  (KR) .......................... 10-2014-0046208
Mar. 30, 2015  (KR) .......................... 10-2015-0043885

(51) Int. Cl.
*H01L 35/24*   (2006.01)
*H01G 9/21*    (2006.01)
(Continued)

(52) U.S. Cl.
CPC ............... *H01L 35/24* (2013.01); *H01G 9/21* (2013.01); *H01L 35/28* (2013.01); *H01M 14/00* (2013.01); *H01M 2300/0002* (2013.01)

(58) Field of Classification Search
CPC ........... H01L 35/24; H01L 35/28; H01G 9/21; H01M 14/00; H01M 2300/0002
See application file for complete search history.

(56) References Cited

U.S. PATENT DOCUMENTS

2011/0048525 A1* 3/2011 Yoneya ................ H01G 9/2022
                                                           136/256

FOREIGN PATENT DOCUMENTS

JP        05-144483       6/1993
KR   10-2009-0020527      2/2009
(Continued)

OTHER PUBLICATIONS

"Hildebrand solubility parameter". Wikipedia. Accessed Jun. 17, 2018.*
(Continued)

*Primary Examiner* — Harold Y Pyon
*Assistant Examiner* — Danny N Kang
(74) *Attorney, Agent, or Firm* — Norton Rose Fulbright US LLP

(57) ABSTRACT

In one aspect of the present disclosure, there is provided an electrolyte solution for a thermoelectric device, the solution comprising: a redox couple; water; and a polar organic solvent.

6 Claims, 2 Drawing Sheets

(51) Int. Cl.
*H01L 35/28* (2006.01)
*H01M 14/00* (2006.01)

(56) References Cited

FOREIGN PATENT DOCUMENTS

| KR | 10-2010-0098157 | 9/2010 |
| KR | 10-1078304 | 10/2011 |
| WO | WO 2012/140856 | 10/2012 |

OTHER PUBLICATIONS

"Ethanol (data page)". Wikipedia. Accessed Jun. 17, 2018.*
International Search Report issued in PCT/KR2015/003653, dated May 20, 2015.

* cited by examiner

[FIG. 1]
[FIG. 2]
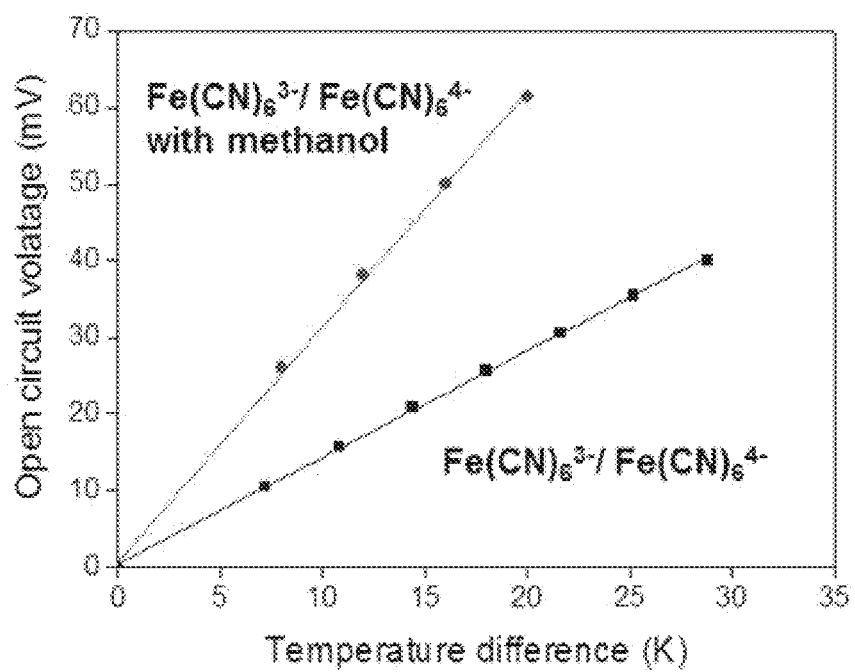

[FIG. 3A]
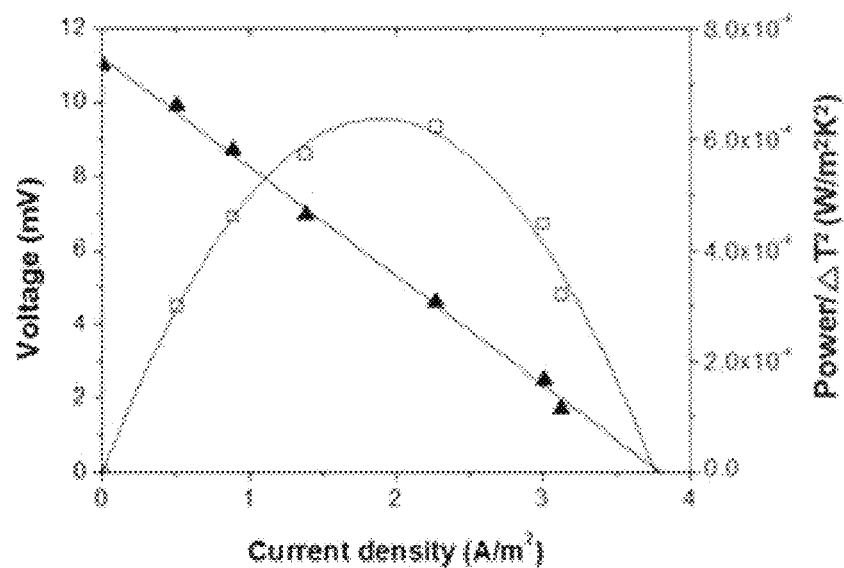
[FIG. 3B]
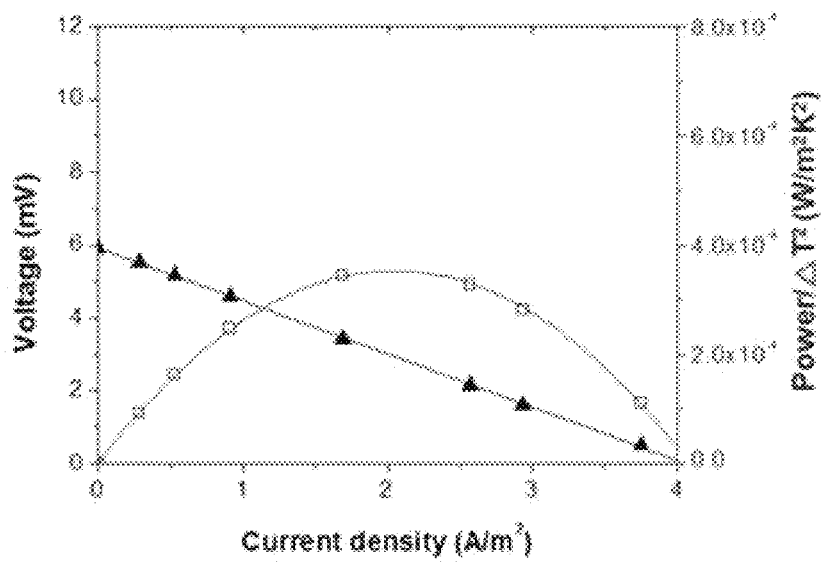

ELECTROLYTE SOLUTION FOR THERMOELECTRIC DEVICE AND THERMOELECTRIC DEVICE INCLUDING THE ELECTROLYTE SOLUTION

CROSS-REFERENCE TO RELATED APPLICATIONS

This application is a national phase application under 35 U.S.C. § 371 of International Application No. PCT/KR2015/003653 filed 13 Apr. 2015, which claims priority to Korean Patent Application No. 10-2015-0043885 filed 30 Mar. 2015, and Korean Patent Application No. 10-2014-0046208 filed 17 Apr. 2014. The entire contents of each of the above-referenced applications are incorporated into the present application by reference.

BACKGROUND

Field of the Present Disclosure

The present disclosure relates to an electrolyte solution for a thermoelectric device and a thermoelectric device including the electrolyte solution. More particularly, the present disclosure relates to an electrolyte solution for a thermoelectric device wherein a temperature difference between electrodes sandwiching the electrolyte solution allow the electrolyte solution to convert a thermal energy to an electrical energy, and to a thermoelectric device including the electrolyte solution.

Discussion of Related Art

A thermoelectric device may exhibit a thermoelectric effect. The device may use Seebeck effect to use a temperature difference for electrical generation. The thermoelectric device has been widely used in various fields of space, airplane, semiconductor, power generation, etc.

Currently, the energy harvesting has been popular worldwide. In this connection, the thermoelectric device using the Seebeck effect to convert the waste thermal energy to the electrical energy has been focused on. Thermal batteries including, for example, thermogalvanic cells or thermal electrochemical cells may generate electrical energy based on a dependency of an electrochemical redox voltage of an electrolyte on a temperature. Such thermal batteries may have advantages of direct thermal-electrical energy conversion, simple configuration, semi-permanent durability, low maintenance cost, and no carbon-emission. Thus, the thermal batteries have been reported as the most effective technique for the energy harvesting using waste heat. In particular, mechanical flexibility and low production cost thereof may realize efficient absorption of waste heats from daily life below 100° C. Recently, thermoelectric devices using a thermoelectric electrolyte have been studied for improvement of power generation efficiency.

An output voltage of a thermoelectric device having a liquid electrolyte may be proportional to a thermoelectric coefficient as a voltage per a unit temperature difference. The power thereof may be proportional to a square of the voltage. Thus, in order to improve the output voltage and power of the thermoelectric device, a liquid electrolyte with a high thermoelectric coefficient is needed. Generally, an aqueous solution-based electrolyte including potassium ferricyanide ($K_3[Fe\ CN_6]$) and potassium ferrocyanide ($K_4[Fe\ CN_6]$) has been used. This electrolyte exhibits about 1.43 mV/Ka of a thermoelectric coefficient.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

The present disclosure is to provide an electrolyte solution with a high thermoelectric coefficient for a thermoelectric device.

Further, the present disclosure is to provide a thermoelectric device with improved output voltage and power generation.

In one aspect of the present disclosure, there is provided an electrolyte solution for a thermoelectric device, the solution comprising: a redox couple; water; and a polar organic solvent.

In one implementation, the polar organic solvent has a Hildebrand Solubility parameter (HSP) in a range of 19 $MPa^{1/2}$ to 35 $MPa^{1/2}$.

In one implementation, the polar organic solvent has a dielectric constant in a range of 20 to 47.

In one implementation, the redox couple includes at least one selected from a group consisting of $Fe_2\ SO_{4\ 3}/FeSO_4$, $I^-/I^{3-}$, $Np^{4+}/NpO_2^+$, $Pu^{4+}/PuO_2^{2+}$, $CN^-/CNO^-$, $NO_2^-/NO_3^-$, $I^-/IO_3^-$, $ClO_3^-/ClO_4^-$, $ClO^-/ClO_2^-$, $Cl^-/ClO^-$, $K_3Fe\ CN_6/K_4Fe\ CN_6$, $K_3Fe\ CN_6/NH_{4\ 4}Fe\ CN_6$, $Np^{3+}/Np^{4+}$, $Cu^+/Cu^{2+}$, $Fe^{2+}/Fe^{3+}$, $PuO_2^+/PuO_2^{2+}$, $Pu^{3+}/Pu^{4+}$, $NpO_2^+/NpO_2^{2+}$, $Tl^+/Tl^{3+}$, $NH_4^+/N_2H_5^+$, $NH_4+/NH_3OH^+$, $Mn^{2+}/Mn^{3+}$ and $Am^{3+}/Am^{4+}$.

In one implementation, the solution has a thermoelectric coefficient in a range of 1.5 mV/K to 3.0 m/K.

In one implementation, the polar organic solvent includes an alcohol-based compound.

In one implementation, the polar organic solvent includes an alcohol-based compound.

In one implementation, the alcohol-based compound includes at least one selected from a group consisting of 1-propanol, 2-propene-1-ol, 2-chloroethanol, ethanol, 1,4-butanediol and methanol.

In one implementation, the polar organic solvent includes at least one selected from a group consisting of 2,2-dimethylpropanenitrile, butanenitrile, 2-methylpropanenitrile, bis(2-chloroethyl)ether, acetone, methoxysulfinyloxymethane, 1-chloro-2,3-epoxypropane, 2,4-pentanedione, 2-methyl-2-nitropropane, 2-bromopyridine, 2-nitropropane, benzonitrile, 1-formylpiperidine, propanenitrile, N,N-diethylformamide, ethyl thiocyanate, 3-methylsulfolane, chloroacetonitrile, hexamethylphosphoramide, N,N-diethylacetamide, diethylene glycol, N-methyl-2-pyrrolidone (NMP), propylene glycol, 2-propenenitrile, N,N-dimethylpropionamide, 4,5-dichloro-1,3-dioxolan-2-one, nitrobenzene, nitromethane, 1,3-dimethyltetrahydropyrimidin-2(1H)-one, N,N-dimethyl-formamide (N,N-DMF), acetonitrile, N,N-dimethylacetamide, dimethyl sulfoxide, etc.

In one aspect of the present disclosure, there is provided a thermoelectric device comprising: a first electrode; a second electrode; and an electrolyte solution between the first and second electrodes, wherein the solution includes the above-defined electrolyte solution.

In accordance with the present disclosure, the electrolyte solution for a thermoelectric device may include the polar organic solvent in order to remarkably improve the thermoelectric coefficient. Using the electrolyte solution for the thermoelectric device, the thermoelectric device may improve the output voltage and power generation. The electrolyte solution may be produced without development of novel electrolytes, thereby to reduce a production cost of the thermoelectric device.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1 is a cross-sectional view of a thermoelectric device in accordance with one embodiment of the present disclosure.

FIG. 2 is a graph of an open circuit voltage over a temperature difference for thermoelectric devices including the electrolyte solutions of the embodiment 1 and comparison 1 respectively.

FIG. 3A is a graph for illustrating characteristics of the thermoelectric device including the electrolyte solution of the embodiment 2.

FIG. 3B is a graph for illustrating characteristics of the thermoelectric device including the electrolyte solution of the comparison 1.

DETAILED DESCRIPTIONS

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, s, operations, elements, and/or components, but do not preclude the presence or addition of one or more other features, integers, s, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure."

FIG. 1 is a cross-sectional view of a thermoelectric device in accordance with one embodiment of the present disclosure.

Referring to FIG. 1, a thermoelectric device 500 may include a first electrode 100, a second electrode 200 and an electrolyte solution ELT. Although not shown in the figure, the thermoelectric device 500 may include a first electrode collector contacting a first electrode 100, a second electrode collector contacting the second electrode 200, and a mold frame receiving therein an electrolyte solution ELT.

The first electrode 100 and second electrode 200 may face away from each other. The second electrode 200 may act as a hot electrode to have higher temperature than that of the first electrode 100, while the first electrode 100 may act as a cold electrode. When there occurs a temperature difference between the first electrode 100 and second electrode 200, an electrolyte in the electrolyte solution ELT adjacent to the second electrode 200 may be oxidized. Using the oxidation of the electrolyte, the second electrode 200 may receive an electron, and, thus, the electron may be supplied from the second electrode 200 to an external load coupled thereto to generate electric power. The electron may be supplied to the first electrode 100 via the external load coupled thereto. Thus, the first electrode 100 may supply the electron to the electrolyte to reduce the electrolyte. The redox reaction of the electrolyte may allow the electrolyte solution ELT to be kept at an electrically equilibrium state for continuous power generation.

The electrolyte solution ELT may include a redox couple, water and a polar organic solvent.

In redox processes, the reductant transfers electrons to the oxidant. Thus, in the reaction, the reductant or reducing agent loses electrons and is oxidized, and the oxidant or oxidizing agent gains electrons and is reduced. The pair of an oxidizing and reducing agent that are involved in a particular reaction is called a redox pair or couple. A redox couple is a reducing species and its corresponding oxidized form.

The redox couple may include, but limited thereto, $Fe_2SO_{4\ 3}/FeSO_4$, $I^-/I^{3-}$, $Np^{4+}/NpO_2^+$, $Pu^{4+}/PuO_2^{2+}$, $CN^-/CNO^-$, $NO_2^-/NO_3^-$, $I^-/IO_3^-$, $ClO_3^-/ClO_4^-$, $ClO^-/ClO_2^-$, $Cl^-/ClO^-$, $K_3Fe\ CN_6/K_4Fe\ CN_6$, $K_3Fe\ CN_6/NH_{4\ 4}Fe\ CN_6$, $Np^{3+}/Np^{4+}$, $Cu^+/Cu^{2+}$, $Fe^{2+}/Fe^{3+}$, $PuO_2^+/PuO_2^{2+}$, $Pu^{3+}/Pu^{4+}$, $NpO_2^+/NpO_2^{2+}$, $Tl^+/Tl^{3+}$, $NH_4^+/N_2H_5^+$, $NH_4^+/NH_3OH^+$, $Mn^{2+}/Mn^{3+}$, $Am^{3+}/Am^{4+}$, etc. The redox couples may be used alone or in a combination of at least two thereof.

The Hildebrand Solubility Parameter (HSP) of the polar organic solvent may be in a range of 19 $MPa^{1/2}$ to 35 $MPa^{1/2}$. When the HSP is smaller than 19 $MPa^{1/2}$ or is larger than 35 $MPa^{1/2}$, it may be confirmed that substantial increase in a thermoelectric coefficient is absent. This is because when the HSP is smaller than 19 $MPa^{1/2}$ or is larger than 35 $MPa^{1/2}$, the polar organic solvent could not be mixed with water, or, due to a large cluster size thereof, a state of the redox couple may be a state where it seems like that the polar organic solvent is not present, that is, the same state as a state where the redox couple is dissociated with the water or the organic solvent. Thus, it may be estimated that there is no entropy increase of the redox couple determining the thermoelectric coefficient.

However, it is confirmed that when the Hildebrand Solubility Parameter (HSP) of the polar organic solvent is in a range of 19 $MPa^{1/2}$ to 35 $MPa^{1/2}$, the thermoelectric coefficient increases. That is, when the Hildebrand Solubility Parameter (HSP) of the polar organic solvent is in a range of 19 $MPa^{1/2}$ to 35 $MPa^{1/2}$, an interaction between the polar organic solvent and redox couple increases and solvation by water and polar organic solvent is achieved. Thus, the reaction entropy of the redox couple may increase. In this way, using the polar organic solvent having the Hildebrand Solubility Parameter (HSP) in a range of 19 $MPa^{1/2}$ to 35 $MPa^{1/2}$, the reaction entropy may increase and, thus, the thermoelectric coefficient may increase. For this reason, the applicants discover that electrolyte solution containing the above listed redox couples and the polar organic solvent having the Hildebrand Solubility Parameter (HSP) in a range of 19 $MPa^{1/2}$ to 35 $MPa^{1/2}$ may exhibit an increased thermoelectric coefficient.

Further, the polar organic solvent may have a dielectric constant in a range of 20 to 47. When the dielectric constant of the polar organic solvent is lower than 20, there is no change of the thermoelectric coefficient, that is, the thermoelectric coefficient may be substantially the same as the existing thermoelectric coefficient 1.43 mV/K. This is because that solvation between the redox couple and water is relatively stronger and thus there is no substantial reaction entropy increase. To the contrary, in accordance with the present disclosure, when the polar organic solvent is used together with water, and, further, the polar organic solvent has a dielectric constant in a range of 20 to 47, the resulting solution may exhibit a solvation state in which water and polar organic solvent are inter-dispersed. Thus, a number of states of the redox couple may increase, that is, a solvation entropy increases, thereby to raise the thermoelectric coefficient.

Under a similar principle, when the polar organic solvent is used together with water, and, further, the dielectric constant of the polar organic solvent is higher than 47, the redox couple is mainly solvated with the polar organic solvent rather water. Thus, a number of states of the redox couple may not increase, that is, a solvation entropy may not increase, thereby to keep the thermoelectric coefficient as it is.

Under the similar principle, the electrolyte solution containing the listed redox couples, and the polar organic solvent having the dielectric constant in a range of 20 to 47 may allow thermoelectric coefficient increase.

As a result, the electrolyte solution ELT of the present disclosure may exhibit the thermoelectric coefficient 1.5 mV/K to 3.0 m/K using the above-defined polar organic solvent.

In one embodiment, the polar organic solvent may include an alcohol-based compound. Examples of the alcohol-based compounds may include, but not limited thereto, 1-propanol, 2-propene-1-ol, 2-chloroethanol, ethanol, 1,4-butanediol, methanol, or etc. The alcohol-based compounds may be used each alone or in combination of two or more. Preferably, when ethanol and/or methanol is used as the alcohol-based compound, the thermoelectric coefficient of the electrolyte solution ELT may amount to 2.5 mV/K to 3.5 mV/K.

Another example of the polar organic solvent may include, but not limited thereto, 2,2-dimethylpropanenitrile, butanenitrile, 2-methylpropanenitrile, bis(2-chloroethyl) ether, acetone, methoxysulfinyloxymethane, 1-chloro-2,3-epoxypropane, 2,4-pentanedione, 2-methyl-2-nitropropane, 2-bromopyridine, 2-nitropropane, benzonitrile, 1-formylpiperidine, propanenitrile, N,N-diethylformamide, ethyl thiocyanate, 3-methylsulfolane, chloroacetonitrile, hexamethylphosphoramide, N,N-diethylacetamide, diethylene glycol, N-methyl-2-pyrrolidone (NMP), propylene glycol, 2-propenenitrile, N,N-dimethylpropionamide, 4,5-dichloro-1,3-dioxolan-2-one, nitrobenzene, nitromethane, 1,3-dimethyl-tetrahydropyrimidin-2(1H)-one, N,N-dimethyl-formamide (N,N-DMF), acetonitrile, N,N-dimethylacetamide, dimethyl sulfoxide, etc. These compounds may be used each alone or in combination of two or more.

Preferably, when N-methyl-2-pyrrolidone (NMP), methanol and/or N,N-dimethyl-formamide (N,N-DMF) are used as the polar organic solvent, the thermoelectric coefficient of the electrolyte solution ELT may amount to 2.8 mV/K to 3.0 m/K.

When a weight of a mixture of water and polar organic solvent is defined as 100%, a weight of the polar organic solvent may be in a range of 5% to 25%. When a weight of the polar organic solvent is smaller than 5%, thermoelectric coefficient increase due to the addition of the polar organic may not be achieved. When a weight of the polar organic solvent is larger than 25%, the thermoelectric coefficient change may be very slight. Preferably, the content of the polar organic solvent may be in a range of 8% by weight to 20% by weight.

Further, a content ratio between the polar organic solvent and redox couple may be above 57:1. When a concentration of the redox couple is 0.15 M (mol), and the content of the polar organic solvent is at least 25% by weight, the thermoelectric coefficient may increase. Further, when a concentration of the redox couple is 0.6 M (mol), and the content of the polar organic solvent is at least 5% by weight, the thermoelectric coefficient may increase.

In the present disclosure, using water and the above-defined polar organic solvent as solvents of the electrolyte solution ELT, the redox couple may be effectively solvated to increase the thermoelectric coefficient thereof. The thermoelectric coefficient increase of the electrolyte solution ELT may lead to output voltage increase of the thermoelectric device and, thus, improved power generation thereof.

With reference to following present embodiments and a comparison example, the effect of thermoelectric coefficient increase of the electrolyte solution ELT containing water and the polar organic solvent will be described. In the following embodiments, $K_3Fe CN_6/NH_{4\ 4}Fe CN_6$ may be used as the redox couple. However, the present disclosure may not be limited thereto. The above-listed various redox couples may be used to achieve thermoelectric coefficient increase of the electrolyte solution ELT.

Electrolyte Solution Production (Embodiment 1 and Comparison 1) and Thermoelectric Coefficient Measurement-1

Potassium ferricyanide and potassium ferrocyanide are dissolved in water to form a first solution. Then, methanol is added to the first solution to form an electrolyte solution in accordance with the embodiment 1 of the present disclosure. In this connection, a weight ratio between methanol and water is 2:8.

Further, Potassium ferricyanide and potassium ferrocyanide are dissolved in water to form a first solution. Then, using the first solution, an electrolyte solution in accordance with a comparison 1 is prepared.

Then, for the electrolyte solutions of the embodiment 1 and comparison 1, a temperature difference (unit K) between hot and cold electrodes, and an open circuit voltage (unit mV) are measured. The measurement results may be shown in FIG. 2. Further, thermoelectric devices including the electrolyte solutions of the embodiment 1 and comparison 1 respectively are prepared as shown in FIG. 1.

FIG. 2 is a graph of an open circuit voltage over a temperature difference for thermoelectric devices including the electrolyte solutions of the embodiment 1 and comparison 1 respectively.

Referring to FIG. 2, the thermoelectric coefficient of the electrolyte solution of the embodiment 1 is about 3 mV/K, while the thermoelectric coefficient of the electrolyte solution of the comparison 1 is about 1.4 mV/K. From this, it is confirmed that the thermoelectric coefficient of the electrolyte solution of the embodiment 1 including methanol is more than 2 times larger than the thermoelectric coefficient of the electrolyte solution of the comparison 1 in a relative manner or that the thermoelectric coefficient of the electrolyte solution of the embodiment 1 including methanol is about 3 mV/K larger than the thermoelectric coefficient of the electrolyte solution of the comparison 1 in an absolute manner.

Electrolyte Solution Production (Embodiment 2)

Potassium ferricyanide and potassium ferrocyanide are dissolved in water to form a first solution. Then, methanol with about 33 of a dielectric constant is added to the first solution to form an electrolyte solution in accordance with the embodiment 2 of the present disclosure. In this connection, a weight ratio between methanol and water is 2:8. Further, thermoelectric devices including the electrolyte solutions of the embodiment 2 and comparison 1 respectively are prepared as shown in FIG. 1.

Thermoelectric Device Evaluation

For the thermoelectric devices including the electrolyte solutions of the embodiment 2 and comparison 1 respectively, a voltage and power over a current density are measured. The measurement results are shown in FIG. 3A and FIG. 3B.

FIG. 3A is a graph for illustrating characteristics of the thermoelectric device including the electrolyte solution of the embodiment 2. FIG. 3B is a graph for illustrating characteristics of the thermoelectric device including the electrolyte solution of the comparison 1. By comparison between the graphs of FIG. 3A and FIG. 3B, it is confirmed that the present embodiment 2 wherein the electrolyte solution contains the methanol and water as the solvents has a remarkable improved output voltage and power of the thermoelectric device compare to the comparison 1 wherein the electrolyte solution contains only water as the solvent.

Electrolyte Solution Production (Embodiments 3 to 13 and Thermoelectric Coefficient Measurement-2

Potassium ferricyanide $K_3[Fe CN_6]$ and potassium ferrocyanide $K_4[Fe CN_6]$ are dissolved in water to form a first solution. Then, polar organic solvents as listed in a following table 1 are added to the first solution to form electrolyte solutions in accordance with the embodiments 3 to 13 of the present disclosure respectively. Further, thermoelectric devices including the electrolyte solutions of the embodiments 3 to 13 respectively are prepared as shown in FIG. 1. For the thermoelectric devices including the electrolyte solutions of the embodiments 3 to 13, thermoelectric coefficients thereof are measured. The measurement results are shown in the table 1.

TABLE 1

| Embodiment | Polar organic solvent | Dielectric constant | Organic solvent: water (by weight %) | Thermoelectric coefficient (mV/K) | HSP $(MPa)^{1/2}$ |
|---|---|---|---|---|---|
| Embodiment 3 | Acetone | 21.00 | 2:8 | 2.84 | 19.7 |
| Embodiment 4 | Ethanol | 25.00 | 2:8 | 3.00 | 26.2 |
| Embodiment 5 | N-methyl-2-pyrrolidone | 32.00 | 2:8 | 2.90 | 23.0 |
| Embodiment 6 | Propylene glycol | 32.10 | 2:8 | 2.24 | 30.7 |
| Embodiment 7 | N,N-dimethyl-formamide | 36.70 | 2:8 | 2.80 | 24.7 |
| Embodiment 8 | Dimethyl sulfoxide | 47 | 2:8 | 2.80 | 26.4 |
| Embodiment 9 | Hexane | 1.89 | 2:8 | 1.43 | 14.9 |
| Embodiment 10 | chloroform | 5.00 | 2:8 | 1.43 | 18.7 |
| Embodiment 11 | sorbitol | 62 | 2:8 | 1.46 | 38.15 |
| Embodiment 12 | formamide | 109 | 2:8 | 1.43 | 36.7 |
| Embodiment 13 | N-methyl-formamide | 190 | 2:8 | 1.4 | 30.1 |

Referring to the table 1, thermoelectric coefficients of the electrolyte solutions of the embodiments 3 to 8 have at least 2.24 mV/K and, thus, are remarkably improved compared to that in the comparison 1.

To the contrary, thermoelectric coefficients of the electrolyte solutions of the embodiments 9 and 10 wherein the dielectric constant of the polar organic solvent is equal to or smaller than 5 or the HSP thereof is below 19 are substantially equal to the thermoelectric coefficient in the comparison 1.

Further, thermoelectric coefficients of the electrolyte solutions of the embodiments 11 to 13 wherein the dielectric constant of the polar organic solvent is equal to or larger than 62 or the HSP thereof is above 35 are substantially equal to the thermoelectric coefficient in the comparison 1.

That is, using the polar organic solvents of the embodiments 3 to 8, the thermoelectric coefficient may increase above 2.24 mV/K and reach 3.0 mV/K. Further, using the polar organic solvents having the HSPs thereof in a range of 19.7 MPa$^{1/2}$ to 34.9 MPa$^{1/2}$, the thermoelectric coefficient may improve at least two times compared to the comparison 1.

Relationship Between Redox Couple Content and Polar Organic Solvent Content

When a weight of a mixture of water and methanol is defined as 100%, a content of methanol is reduced from 25% by weight by 5% unit to 5% by weight. Further, molar concentrations of Potassium ferricyanide and potassium ferrocyanide mixed with the mixture of water and methanol are changed to 0.15 M, 0.2 M, 0.3 M, 0.4 M, 0.5 M, 0.6 M, 0.65 M and 0.7 M. For each case, each thermoelectric coefficient is measured. From the measurement results, when the methanol content is 20% by weight and molar concentrations of Potassium ferricyanide and Potassium ferrocyanide mixed with the mixture of water and methanol are in a range of 0.1 M to 0.2 M, about 3 mV/K of the thermoelectric coefficient may be achieved. Further, when the methanol content is 5% by weight and molar concentrations of Potassium ferricyanide and potassium ferrocyanide mixed with the mixture of water and methanol should be equal to or larger than 0.5 M, about 3 mV/K of the thermoelectric coefficient may be achieved.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. An electrolyte solution for a thermoelectric device, the solution comprising:
    a redox couple;
    water; and
    a polar organic solvent having a Hildebrand Solubility Parameter (HSP) in a range of 19 MPa$^{1/2}$ to 35 MPa$^{1/2}$ and a dielectric constant in a range of 20 to 47,
    wherein the weight ratio of the polar organic solvent to the water is 1:19 to 1:3, and
    wherein the electrolyte solution has a thermoelectric coefficient in a range of 1.5 mV/K to 3.0 mV/K.

2. The electrolyte solution of claim 1, wherein the redox couple includes at least one selected from a group consisting of $Fe_2SO_{4\ 3}/FeSO_4$, $I^-/I^{3-}$, $Np^{4+}/NpO_2^+$, $Pu^{4+}/PuO_2^{2+}$, $CN^-/CNO^-$, $NO_2^-/NO_3^-$, $I^-/IO_3^-$, $ClO_3^-/ClO_4^-$, $ClO^-/ClO_2^-$, $Cl^-/ClO^-$, $K_3Fe\ CN_6/K_4Fe\ CN_6$, $K_3Fe\ CN_6/NH_{4\ 4}Fe\ CN_6$, $Np^{3+}/Np^{4+}$, $Cu^+/Cu^{2+}$, $Fe^{2+}/Fe^{3+}$, $PuO_2^+/PuO_2^{2+}$, $Pu^{3+}/Pu^{4+}$, $NpO_2^+/NpO_2^{2+}$, $Tl^+/Tl^{3+}$, $NH_4^+/N_2H_5^+$, $NH_4+/NH_3OH^+$, $Mn^{2+}/Mn^{3+}$ and $Am^{3+}/Am^{4+}$.

3. The electrolyte solution of claim 1, wherein the polar organic solvent includes an alcohol-based compound.

4. The electrolyte solution of claim 3, wherein the alcohol-based compound includes at least one selected from a group consisting of 1-propanol, 2-propene-1-ol, 2-chloroethanol, ethanol, 1,4-butanediol and methanol.

5. The electrolyte solution of claim 1, wherein the polar organic solvent includes at least one selected from a group consisting of 2,2-dimethylpropanenitrile, butanenitrile, 2-methylpropanenitrile, bis(2-chloroethyl)ether, acetone, methoxysulfinyloxymethane, 1-chloro-2,3-epoxypropane, 2,4-pentanedione, 2-methyl-2-nitropropane, 2-bromopyridine, 2-nitropropane, benzonitrile, 1-formylpiperidine, propanenitrile, N,N-diethylformamide, ethyl thiocyanate, 3-methylsulfolane, chloroacetonitrile, hexamethylphosphoramide, N,N-diethylacetamide, diethylene glycol, N-methyl-2-pyrrolidone (NMP), propylene glycol, 2-propenenitrile, N,N-dimethylpropionamide, 4,5-dichloro-1,3-dioxolan-2-one, nitrobenzene, nitromethane, 1,3-dimethyltetrahydropyrimidin-2(1H)-one, N,N-dimethyl-formamide (N,N-DMF), acetonitrile, N,N-dimethylacetamide, and dimethyl sulfoxide.

6. A thermoelectric device comprising:
    a first electrode;
    a second electrode; and
    an electrolyte solution between the first and second electrodes,
    wherein the solution includes the electrolyte solution of claim 1.

* * * * *